United States Patent
Hidesaka et al.

(10) Patent No.: US 6,551,755 B2
(45) Date of Patent: Apr. 22, 2003

(54) POSITIVE PHOTORESIST COMPOSITION

(75) Inventors: Shinichi Hidesaka, Kanagawa (JP); Atsushi Sawano, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 35 days.

(21) Appl. No.: 09/949,863

(22) Filed: Sep. 12, 2001

(65) Prior Publication Data

US 2002/0061458 A1 May 23, 2002

(30) Foreign Application Priority Data

Sep. 12, 2000 (JP) .......................... 2000-276690

(51) Int. Cl.$^7$ .................................. G03F 7/023
(52) U.S. Cl. ................. 430/191; 430/192; 430/193; 430/326
(58) Field of Search ................. 430/191, 192, 430/193, 326

(56) References Cited

U.S. PATENT DOCUMENTS

| | | | |
|---|---|---|---|
| 5,407,779 A | 4/1995 | Uetani et al. | 430/192 |
| 5,609,982 A * | 3/1997 | Sato et al. | 430/192 |
| 5,667,932 A * | 9/1997 | Sato et al. | 430/192 |
| 5,700,620 A * | 12/1997 | Sakaguchi et al. | 430/191 |
| 5,747,218 A * | 5/1998 | Momota et al. | 430/192 |
| 5,866,724 A | 2/1999 | Ichikawa et al. | 568/270 |
| 5,912,102 A * | 6/1999 | Kawata et al. | 430/191 |
| 6,007,961 A * | 12/1999 | Inomata et al. | 430/191 |
| 6,127,087 A * | 10/2000 | Kobayashi et al. | 430/191 |
| 6,171,750 B1 * | 1/2001 | Inomata et al. | 430/191 |
| 6,207,340 B1 * | 3/2001 | Kurihara et al. | 430/192 |
| 6,296,992 B1 * | 10/2001 | Kurihara et al. | 430/326 |
| 6,300,033 B1 * | 10/2001 | Suzuki et al. | 430/192 |
| 6,406,827 B2 * | 6/2002 | Suzuki et al. | 430/191 |
| 6,492,085 B1 * | 12/2002 | Shimatani et al. | 430/191 |

* cited by examiner

Primary Examiner—John S. Chu
(74) Attorney, Agent, or Firm—Sughrue Mion, PLLC

(57) ABSTRACT

A positive photoresist composition includes (A) an alkali-soluble resin and (B) a photosensitive ingredient, in which the photosensitive ingredient (B) includes an ester of a compound represented by following Formula (I) with a 1,2-naphthoquinonediazidosulfonyl compound:

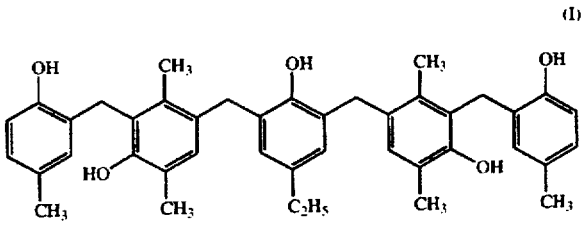

This positive photoresist composition can form a resist pattern mixture including both a dense pattern and an isolation pattern with good shapes and can especially minimize the formation of a back taper shape of an isolation pattern induced by shift of the focus to the minus side.

5 Claims, No Drawings

POSITIVE PHOTORESIST COMPOSITION

BACKGROUND OF THE INVENTION

1. Field of the Invention

The present invention relates to a positive photoresist composition which is satisfactory in sensitivity, definition and depth of focus (DOF) properties, can form a resist pattern with a good shape especially in the formation of a mixture of an isolation pattern and a dense pattern and can minimize the formation of a back taper shape of an isolation resist pattern induced by shift of the focus to the minus side.

2. Description of the Related Art

In the manufacture of an ultralarge-scale integrated circuit (ULSI) where a high definition of not more than half a micrometer, in particular, of not more than 0.35 μm is required, demands have been made on photoresist compositions which can form a resist pattern satisfactory in sensitivity, definition, and DOF properties and having a good shape.

Separately, the manufacture of a highly value-added logic integrated circuit (logic IC) has received attention in recent years. Such a logic IC has a complicated wiring pattern including large portions of irregularly formed line-and-space (hereinafter referred to as "L&S"). In contrast, a dynamic random access memory (DRAM) chip includes large portions of regularly formed L&S.

In a photolithographic process using a photoresist composition, demands have been made to form a resist pattern having a good pattern shape not only in regions where L&S is regularly formed, i.e., in dense pattern regions, but also in regions where L&S is irregularly formed, i.e., in isolation pattern regions.

However, in the formation of an ultrafine resist pattern of not more than half a micrometer, particularly of not more than 0.35 μm, resist patterns having good shapes both in dense patterns and isolation patterns cannot be significantly formed. Specifically, if exposure conditions are changed to yield rectangular dense patterns with good shapes, the shapes of isolation patterns are deteriorated, and, in contrast, if exposure conditions are changed to yield rectangular isolation patterns with good shapes, the shapes of dense patterns are deteriorated.

Consequently, mixed resist patterns including both dense patterns and isolation patterns cannot be significantly formed with good shapes concurrently.

In addition, positive photoresist compositions are liable to invite back taper shapes of isolation patterns, which is caused by sifts of the focus to the minus side, and are liable to induce twist of pattern and exhibit deteriorated focal depth range (DOF) properties in isolation patterns.

Under these circumstances, to concurrently form a mixed resist pattern including both a dense pattern and an isolation pattern with satisfactory sensitivity, definition and DOF properties in the formation of an ultrafine resist pattern of not more than half a micrometer, particularly of not more than 0.35 μm, demands have been made on positive photoresist compositions that can concurrently form a dense pattern and an isolation pattern with good shapes and can minimize the formation of a back taper shape of the isolation resist pattern induced by shift of the focus to the minus side.

Japanese Patent Application Laid-Open No. 6-167805 (Reference 1) discloses a positive photoresist composition containing, as a photosensitive ingredient, a quinonediazidosulfonyl ester of a compound represented by the following formula:

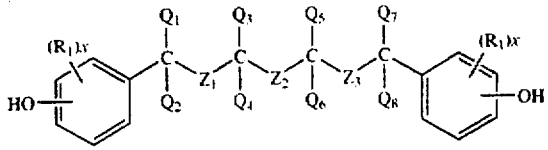

wherein $R_1$ is a hydrogen or halogen atom, $-OCOR_3$, an alkyl or alkoxy group which may be substituted, where $R_3$ is an alkyl or phenyl group which may be substituted; x denotes an integer of from 1 to 3; each of $Q_1$ to $Q_8$ independently a hydrogen atom, an alkyl group or a phenyl group; and each of $Z_1$ to $Z_3$ is independently a divalent phenyl group or a divalent phenyl group substituted with an alkyl group or a hydroxyl group. The reference mentions that this positive resist composition is well-balanced in definition, profile, depth of focus and other properties.

However, the reference fails to describe the formation of mixed resist patterns including both dense patterns and isolation patterns and to describe a specific structure of a compound represented by Formula (1) mentioned below for use in the present invention.

In the formation of mixed resist patterns including both dense patterns and isolation patterns, demands are made on resist compositions that can form both dense patterns and isolation patterns with good shapes and can especially minimize the formation of a back taper shape of the isolation resist patterns induced by shift of the focus to the minus side.

Japanese Patent Application Laid-Open No. 9-110762 (Reference 2) discloses a positive photoresist composition containing, as a photosensitive ingredient, a quinonediazidosulfonyl ester of a compound represented by the following formula:

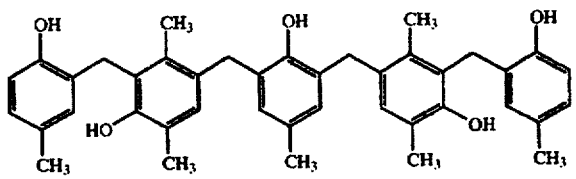

The reference mentions that this composition is a photosensitive resin composition having a high sensitivity, high definition, satisfactory profile, satisfactory focus latitude and less development scum (development residue) and is well balanced in resist properties.

However, the reference fails to describe the formation of mixed resist patterns including both dense patterns and isolation patterns. In the formation of mixed resist patterns including both dense patterns and isolation patterns, demands are made on resist compositions that can form both dense patterns and isolation patterns with good shapes and can especially minimize the formation of a back taper shape of the isolation resist patterns induced by shift of the focus to the minus side.

Japanese Patent Application Laid-Open No. 9-114093 (Reference 3) discloses a positive photoresist composition containing, as a photosensitive ingredient, a quinonediazidosulfonyl ester of a compound represented by the following formula:

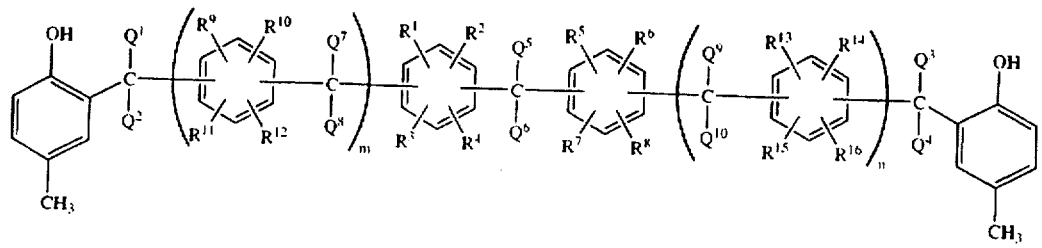

wherein each of $R^1$ to $R^{16}$ is independently a hydrogen, a hydroxyl group, an alkyl having from 1 to 6 carbon atoms or a phenyl; each of $Q^1$ to $Q^{10}$ is independently a hydrogen, an alkyl having from 1 to 6 carbon atoms or a phenyl; and each of m and n independently denotes 0 or 1. The reference mentions that this composition is a photosensitive resin composition having a high sensitivity, high definition, satisfactory profile, satisfactory focus latitude, high heat resistance and less development scum (development residue) and is well balanced in resist properties.

However, the reference fails to describe the formation of mixed resist patterns including both dense patterns and isolation patterns and to describe a specific structure of a compound represented by Formula (I) mentioned below for use in the present invention.

In the formation of mixed resist patterns including both dense patterns and isolation patterns, demands are made on resist compositions that can form both dense patterns and isolation patterns with good shapes and can minimize the formation of a back taper shape of the isolation resist patterns induced by shift of the focus to the minus side.

SUMMARY OF THE INVENTION

Accordingly, an object of the present invention is to provide a positive photoresist composition for use in the formation of an ultrafine resist pattern of not more than half a micrometer, particularly of not more than 0.35 μm. This positive photoresist composition should have a satisfactory sensitivity, definition and DOF properties, can concurrently form a dense pattern and an isolation patter both with good shapes in the formation of a mixture of these resist patterns. Specifically, this positive photoresist composition could minimize the formation of a back taper shape of an isolation resist pattern induced by shift of the focus to the minus side.

After intensive investigations to achieve the above objects, the present inventors have accomplished the present invention.

Specifically, the present invention provides a positive photoresist composition including (A) an alkali-soluble resin and (B) a photosensitive ingredient, in which the photosensitive ingredient (B) includes an ester of a compound represented by following Formula (I) with a 1,2-naphthoquinonediazidosulfonyl compound:

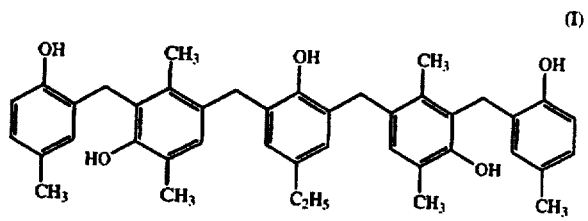

(I)

The aforementioned positive photoresist composition may further include (C) a sensitizer (intensifier).

In the positive photoresist composition, the ester of the compound represented by Formula (I) with the 1,2-naphthoquinonediazidosulfonyl compound preferably occupies equal to or more than 20% by weight of Ingredient (B).

In the positive photoresist composition, the ester contained in Ingredient (B) is preferably obtained by allowing 2 to 3 moles of the 1,2-naphthoquinonediazidosulfonyl compound to react with 1 mole of the compound represented by Formula (I).

Preferably, the amount of Ingredient (B) in the positive photoresist composition is from 10% to 60% by weight relative to the total amount of Ingredient (A) and Ingredient (C) which is added according to necessity.

DETAILED DESCRIPTION OF THE INVENTION (A) Alkali-soluble Resin

Alkali-soluble resins for use as Ingredients (A) are not specifically limited and can be optionally chosen from those generally used as film-forming substances in positive photoresist compositions. Of such resins, condensates of aromatic hydroxy compounds with aldehydes or ketones, polyhydroxystyrenes and derivatives thereof are preferable.

Such aromatic hydroxy compounds include, but are not limited to, phenol; m-cresol, p-cresol, o-cresol, and other cresols; 2,3-xylenol, 2,5-xylenol, 3,5-xylenol, 3,4-xylenol, and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, and other alkyl-substituted phenols; p-methoxyphendl, m-methoxyphenol, p-ethoxyphenol, m-ethoxyphenol, p-propoxyphenol, m-propoxyphenol, and other alkoxy-substituted phenols; o-isopropenylphenol, p-isopropenylphenol, 2-methyl-4-isopropenylphenol, 2-ethyl-4-isopropenylphenol, and other isopropenyl-substituted phenols; phenylphenol, and other aryl-substituted phenols; 4,4'-dihydroxybiphenyl, bisphenol A, resorcinol, hydroquinone, pyrogallol, and other polyhydroxyphenols. Each of these compounds can be used alone or in combination.

The aldehydes include, but are not limited to, formaldehyde, paraformaldehyde, trioxane, acetaldehyde, propionaldehyde, butylaldehyde, trimethylacetaldehyde, acrolein (acrylaldehyde), crotonaldehyde, cyclohexanealdehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, and cinnamaldehyde. Each of these aldehydes can be used alone or in combination. Of these aldehydes, formaldehyde is desirable for its availability. The combination use of a hydroxybenzaldehyde and formaldehyde is specifically preferred in order to improve heat resistance.

The ketones include, for example, acetone, methyl ethyl ketone, diethyl ketone and diphenyl ketone. Each of these ketones may be used alone or in combination. Further, an appropriate combination of an aldehyde and a ketone can be employed.

The condensate of an aromatic hydroxy compound and an aldehyde or a ketone can be prepared in the presence of an acidic catalyst according to a known technique. Such acidic catalysts include, but are not limited to, hydrochloric acid, sulfuric acid, formic acid, oxalic acid, and p-toluenesulfonic acid.

The polyhydroxystyrenes and derivatives thereof include, but are not limited to, vinylphenol homopolymers and copolymers of vinylphenol with a copolymerizable comonomer. Such comonomers include, for example, acrylic acid derivatives, acrylonitrile, methacrylic acid derivatives, methacrylonitrile, styrene, a-methylstyrene, p-methylstyrene, o-methylstyrene, p-methoxystyrene, p-chlorostyrene, and other styrene derivatives.

Of these alkali-soluble resins for use in the present invention as Ingredient (A), preferred resins are alkali-soluble novolak resins each having a weight average molecular weight (Mw) of from 2000 to 20000, and typically from 3000 to 12000.

Among them, typically preferred resins are alkali-soluble novolak resins obtained by condensation reaction of m-cresol and p-cresol with formaldehyde and alkali-soluble novolak resins obtained by condensation reaction of m-cresol, p-cresol and 2,3,5-trimethylphenol with formaldehyde.

(B) Photosensitive Ingredient

Ingredient (B) is a compound having a 1,2-naphthoquinonediazidosulfonyl group. According to the present invention, an ester between a compound of following Formula (I) and a 1,2-naphthoquinonediazidosulfonyl compound is essentially used as Ingredient (B).

(I)

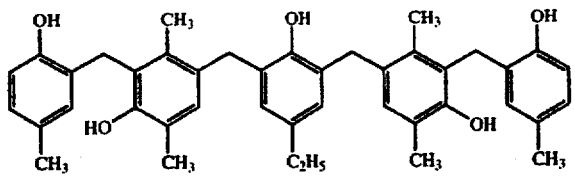

The ester can be prepared, for example, by subjecting a 1,2-naphthoquinonediazidosulfonyl compound such as a 1,2-naphthoquinonediazido-4-sulfonyl halide or a 1,2-naphthoquinonediazido-5-sulfonyl halide to condensation reaction with the compound of Formula (I) to thereby yield a fully or partially esterified compound. The condensation reaction can be generally performed in an organic solvent such as dioxane, N-methylpyrrolidone or dimethylacetamide in the presence of a basic condensing agent such as triethylamine, an alkali carbonate or an alkali hydrogencarbonate.

Preferred esters are 2- to 3-mole esters which are obtained by esterifying 2 to 3 moles of the 1,2-naphthoquinonediazidosulfonyl compound with 1 mole of the compound of Formula (I), of which 2-mole esters are typically preferred.

These esters preferably occupy equal to or more than 20% by weight of, and more preferably equal to or more than 50% by weight of, Ingredient (B). If the content of the esters in Ingredient (B) is less than 20% by weight, the resulting photoresist composition may not sufficiently minimize the formation of a back taper shape of isolation resist patterns induced by shift of the focus to the minus side.

Esters of a 1,2-naphthoquinonediazidosulfonyl compound with a phenolic compound other than the compounds of Formula (I) can also be used as Ingredient (B) for use in the present invention in order to further improve sensitivity, definition and other properties. Such additional phenolic compounds include, but are not limited to, polyphenolic compounds represented by following Formula (II):

(II)

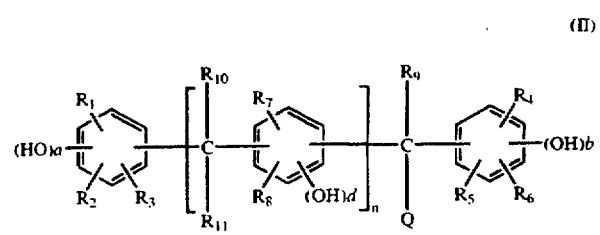

wherein each of $R_1$ to $R_8$ is independently a hydrogen atom, a halogen atom, an alkyl group having from 1 to 6 carbon atoms, an alkoxyl group having from 1 to 6 carbon atoms or a cycloalkyl group; each of $R_9$ to $R_{11}$ is independently a hydrogen atom or an alkyl group having from 1 to 6 carbon atoms; Q is a hydrogen atom or an alkyl group having from 1 to 6 carbon atoms or Q is bonded with $R_9$ to form a cyclic ring having 3 to 6 carbon atom members or a residue represented by following Formula (III); each of a and b independently denotes an integer from 1 to 3; d denotes an integer from 0 to 3; and n denotes an integer from 0 to 3:

(III)

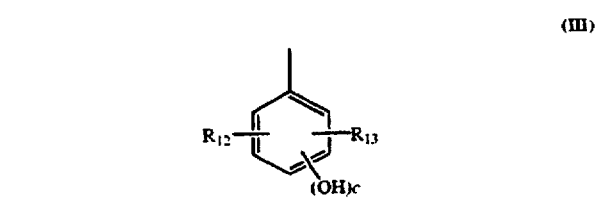

wherein each of $R_{12}$ and $R_{13}$ is independently a hydrogen atom, a halogen atom, an alkyl group having from 1 to 6 carbon atoms, an alkoxyl group having from 1 to 6 carbon atoms or a cycloalkyl group; and c denotes an integer from 1 to 3. The combination use of this type of polyphenolic compounds with Ingredient (A), the alkali-soluble novolak resin, can further improve high sensitivity and high definition.

Of the polyphenolic compounds, preferred compounds are 2,4-bis(3,5-dimethyl-4-hydroxybenzyl)-5-hydroxyphenol, 2,6-bis(2,5-dimethyl-4-hydroxybenzyl)-4-methylphenol, and other linear trinuclear compounds; bis[2,5-dimethyl-3-(4-hydroxy-5-methylbenzyl)-4-hydroxyphenyl]methane, bis [2,5-dimethyl-3-(4-hydroxybenzyl)-4-hydroxyphenyl]methane, bis[3-(3,5-dimethyl-4-hydroxybenzyl)-4-hydroxy-5-methylphenyl]methane, bis[3-(3,5-dimethyl-4-hydroxybenzyl)-4-hydroxy-5-ethylphenyl]methane, bis[3-(3,5-diethyl-4-hydroxybenzyl)-4-hydroxy-5-methylphenyl]methane, bis[3-(3,5-diethyl-4-hydroxybenzyl)-4-hydroxy-5-ethylphenyl]methane, bis[2-hydroxy-3-(3,5-dimethyl-4-hydroxybenzyl)-

5-methylphenyl]methane, bis[2-hydroxy-3-(2-hydroxy-5-methylbenzyl)-5-methylphenyl]methane, bis[4-hydroxy-3-(2-hydroxy-5-methylbenzyl)-5-methylphenyl]methane, bis[2,5-dimethyl-3-(2-hydroxy-5-methylbenzyl)-4-hydroxyphenyl]methane, and other linear tetranuclear compounds; 2,4-bis[2-hydroxy-3-(4-hydroxybenzyl)-5-methylbenzyl]-6-cyclohexylphenol, 2,4-bis[4-hydroxy-3-(4-hydroxybenzyl)-5-methylbenzyl]-6-cyclohexylphenol, 2,6-bis[2,5-dimethyl-3-(2-hydroxy-5-methylbenzyl)-4-hydroxybenzyl]-4-methylphenol, and other linear pentanuclear compounds; and other linear polyphenolic compounds; tris(4-hydroxyphenyl)methane, bis(4-hydroxy-3,5-dimethylphenyl)-4-hydroxyphenylmethane, bis(4-hydroxy-3,5-dimethylphenyl)-3-hydroxyphenylmethane, bis(4-hydroxy-3,5-dimethylphenyl)-2-hydroxyphenylmethane, bis(4-hydroxy-2,5-dimethylphenyl)-4-hydroxyphenylmethane, bis(4-hydroxy-2,5-dimethylphenyl)-3-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3,5-diethylphenyl)-2,4-dihydroxyphenylmethane, bis(4-hydroxy-2,5-dimethylphenyl)-2,4-dihydroxyphenylmethane, bis(4-hydroxyphenyl)-3-methoxy-4-hydroxyphenylmethane, bis(3-cyclohexyl-4-hydroxyphenyl)-3-hydroxyphenylmethane, bis(3-cyclohexyl-4-hydroxyphenyl)-2-hydroxyphenylmethane, bis(3-cyclohexyl-4-hydroxyphenyl)-4-hydroxyphenylmethane, bis (3-cyclohexyl-4-hydroxy-6-methylphenyl)-2-hydroxyphenylmethane, bis(3-cyclohexyl-4-hydroxy-6-methylphenyl)-3-hydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, bis(3-cyclohexyl-6-hydroxyphenyl)-3-hydroxyphenylmethane, bis(3-cyclohexyl-6-hydroxyphenyl)-4-hydroxyphenylmethane, bis (3-cyclohexyl-6-hydroxyphenyl)-2-hydroxyphenylmethane, bis (3-cyclohexyl-6-hydroxy-4-methylphenyl)-2-hydroxyphenylmethane, bis (3-cyclohexyl-6-hydroxy-4-methylphenyl)-4-hydroxyphenylmethane, bis (3-cyclohexyl-6-hydroxy-4-methylphenyl)-3,4-dihydroxyphenylmethane, bis(4-hydroxy-2,3,5-trimethylphenyl)-2-hydroxyphenylmethane, bis(4-hydroxy-2,3,5-trimethylphenyl)-3-hydroxyphenylmethane, bis(4-hydroxy-2,3,5-trimethylphenyl)-4-hydroxyphenylmethane, bis(4-hydroxy-2,3,5-trimethylphenyl)-3,4-dihydroxyphenylmethane, bis(4-hydroxy-2,3,5-trimethylphenyl)-4-hydroxy-3-methoxyphenylmethane, and other trisphenolic polyphenolic compounds.

The amount of Ingredient (B) in the invented positive photoresist composition is preferably from 10% to 60% by weight, and more preferably from 20% to 50% by weight relative to the total weight of the alkali-soluble resin ingredient (A), and a sensitizer (intensifier) ingredient (C) added according to necessity as mentioned below. If the amount of Ingredient (B) is less than the above range, images in exact accordance with patterns cannot be obtained, and transferring property is deteriorated. In contrast, if the amount of Ingredient (B) exceeds the above specified range, sensitivity and uniformity of the resulting resist film may be deteriorated, and definition may be decreased.

(C) Sensitizer (Intensifier)

Sensitizers (intensifiers) for use as Ingredients (C) in the invented photoresist composition are not specifically limited, and any known sensitizers such as the polyphenolic compounds of Formula (II) above can be used. Of these sensitizers, preferred compounds are, for example, bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, and 1,1-bis(4-hydroxyphenyl)cyclohexane.

Among them, bis(4-hydroxy-2,3,5-trimethylphenyl)-2-hydroxyphenylmethane, bis(4-hydroxy-3,5-dimethylphenyl)-3,4-dihydroxyphenylmethane, 2,4-bis(3,5-dimethyl-4-hydroxyphenylmethyl)-6-methylphenol and 4,6-bis[1-(4-hydroxyphenyl)isopropyl]resorcin are typically preferred.

Alternately, compounds represented by following Formula (IV) are also preferred:

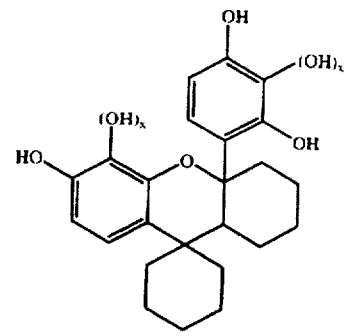

(IV)

wherein x denotes 0 or 1.

When Ingredient (C) is incorporated in the invented positive photoresist composition, the content of Ingredient (C) is preferably 5% to 50% by weight, and more preferably 10% to 35% by weight, relative to the weight of the alkali soluble resin ingredient (A). When the sensitizer (intensifier) (C) is used in the invented positive photoresist composition within the above range, the resulting composition has further improved exposure margin, definition, and DOF properties and exhibits a satisfactory sensitivity.

In addition to the above specified ingredients, where necessary, the invented positive photoresist composition may further comprise any of compatible additives including, for example, ultraviolet absorbents for inhibition of halation and surfactants for prevention of striation within ranges not adversely affecting the objects of the invention. Such ultraviolet absorbents include, for example, 2,2'4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. The surfactants include, for example, Fluorad FC-430 and FC-431 (trade names, available from Fluorochemical-Sumitomo 3M Co.), F-TOP EF122A, EF122B, EF122C, and EF126 (trade names, available from Tohkem Products Corporation) and other fluorine-containing surfactants.

The invented positive photoresist composition is preferably used as a solution obtained by dissolving each of Ingredients (A) and (B), and where necessary Ingredient (C) and other additional ingredients in an appropriate solvent. Such solvents include those conventionally used in positive photoresist compositions, such as acetone, methyl ethyl ketone, cyclohexanone, methyl isoamyl ketone, 2-heptanone, and other ketones; ethylene glycol, propylene glycol, diethylene glycol, ethylene glycol monoacetate, propylene glycol monoacetate, diethylene glycol monoacetate, or monomethyl ethers, monoethyl ethers, monopropyl ethers, monobutyl ethers or monophenyl ethers thereof, and other polyhydric alcohols and derivatives thereof; dioxane and other cyclic ethers; and ethyl lactate, methyl acetate, ethyl acetate, butyl acetate, methyl pyruvate, ethyl pyruvate, methyl methoxypropionate, ethyl ethoxypropionate, and other esters. Each of these solvents can be used alone or in combination. of these solvents, typically preferred solvents are acetone, methyl ethyl ketone, cyclohexanone, methyl isoamyl ketone, 2-heptanone, and other ketones; and ethyl lactate, methyl acetate, ethyl acetate, butyl acetate, methyl pyruvate, ethyl pyruvate, methyl methoxypropionate, ethyl ethoxypropionate, and other esters.

Practically, the invented positive photoresist composition may be preferably used, for example, in the following manner: Each of Ingredients (A), (B), (C) and other ingredients added according to necessity is dissolved in an appropriate solvent as mentioned above to yield a coating solution; the coating solution is then applied, using a spinner or the like, onto a substrate such as a silicon wafer or a substrate on which an antireflection coating has been formed, and is then dried to form a photosensitive layer; next, the photosensitive layer is irradiated and exposed to light from an ultraviolet source such as a low-pressure mercury lamp, a high-pressure mercury lamp, an ultra-high-pressure mercury lamp, an arc lamp, or a xenon lamp, through a desired mask pattern, or irradiated with a scanning electron beam; and the exposed portions of the film are then dissolved and removed by dipping the substrate in a developer solution, for example, an alkaline aqueous solution such as a 1% to 10% by weight tetramethylammonium hydroxide (TMAH) aqueous solution, thus forming an image being in exact accordance with the mask pattern.

EXAMPLES

The present invention will be further illustrated in detail with reference to several invented examples and comparative examples below.

The properties of the resulting positive photoresist compositions were evaluated by the following methods and are shown in Table 2.

(1) Sensitivity

A sample was applied onto a silicon wafer using a spinner, and was dried on a hot plate at 90° C. for 90 sec. to form a resist film 1.05 μm thick. The resist film was then irradiated through a mask for an increasing period from 0.1 sec. at intervals of 0.01 sec. using a reducing-type projection aligner NSR-2005i10D (available from Nikon corporation, Japan; NA=0.57) through a mask (reticle) corresponding to a 0.35-μm resist pattern with a line-and-space (L&S) width of 1:1. The film was then post-exposure baked (PEB) at 110° C. for 90 sec.; subjected to developing in a 2.38% by weight tetramethylammonium hydroxide aqueous solution at 23° C. for 60 sec., rinsed with water for 30 sec., and dried. In this procedure, the sensitivity was defined as the exposure time period (Eop) in milliseconds (ms) to exactly reproduce a 0.35-μm resist pattern with a line-and-space (L&S) width of 1:1.

(2-1) Depth of Focus Properties in Isolation Pattern

A sample was subjected to exposure and development operations using a reducing-type projection aligner NSR-2005i10D (available from Nikon Corporation, Japan; NA=0.57) at an exposure of Eop [the exposure time period to exactly reproduce the set dimensions of a mask pattern (line width: 0.35 μm, L&S=1:1)] as a standard exposure, whereas the focus was shifted up and down at this exposure. The resulting isolation resist patterns were subjected to scanning electron micrographic (SEM) observation. Based upon the SEM photograph, the depth of focus property in an isolation pattern was defined as the maximum value (μm) of the focal shift (defocus) to reproduce a 0.35-μm rectangular resist pattern within a variation of ±10% of the set dimensions.

(2-2) Depth of Focus Properties in Dense Pattern

A sample was subjected to exposure and development operations using a reducing-type projection aligner NSR-2005i10D (available from Nikon Corporation, Japan; NA=0.57) at an exposure of Eop [the exposure time period to exactly reproduce the set dimensions of a mask pattern (line width: 0.35 μm, L&S=1:1)] as a standard exposure, whereas the focus was shifted up and down at this exposure. The resulting dense resist patterns (line width: 0.35 μm, L&S=1:1) were subjected to SEM observation. Based upon the SEM photograph, the focal depth range property in a dense pattern was defined as the maximum value (μm) of the focal shift (defocus) to reproduce a 0.35-μm rectangular resist pattern with L&S of 1:1 within a variation of ±10% of the set dimensions.

(3) Total Process Margin

Using a mask substrate on which both an isolation pattern and a dense pattern were patterned, a sample was subjected to exposure and development operations at an exposure of Eop [the exposure time period to exactly reproduce the set dimensions of a mask pattern (line width: 0.35 μm, L&S=1:1)] as a standard exposure, where the focus was shifted up and down at this exposure. The resulting dense resist pattern (line width: 0.35 μm, L&S=1:1) and isolation resist pattern (size: 0.35 μm) were subjected to SEM observation. Based upon the SEM photographs, the total process margin was defined as the maximum value (μm) of the focal shift (defocus) to reproduce a 0.35-μm rectangular resist pattern within a variation of ±10% of the set dimensions both in the dense resist pattern and in the isolation resist pattern.

(4) Evaluation of Isolation Pattern Shape on Shift of Focus to Minus Side

A sample was subjected to exposure and development operations at an exposure of Eop [the exposure time period to exactly reproduce the set dimensions of a mask pattern (line width: 0.35 μm, L&S=1:1)] as a standard exposure, whereas the focus was shifted 0.5 μm to the minus side (the resist surface side). The obtained isolation resist pattern was subjected to SEM observation.

(5) Definition

The definition was defined as the critical definition at an exposure which reproduced a 0.35-μm mask pattern with L&S of 1:1.

Example 1

Ingredient (A): An alkali-soluble novolak resin [a mixture (1:1 by weight) of a novolak resin comprising m-cresol/p- cresol/2,3,5-trimethylphenol (35/40/25 in molar ratio) and having a weight average molecular weight (Mw) of 5000 with a novolak resin comprising m-cresol/p-cresol (42.5/57.5 in molar ratio) and having a weight average molecular weight (Mw) of 6000]

Ingredient (B): A reaction product of 1 mole of the following phenolic compound with 2 moles of 1,2-naphthoquinonediazide-5-sulfonyl chloride:

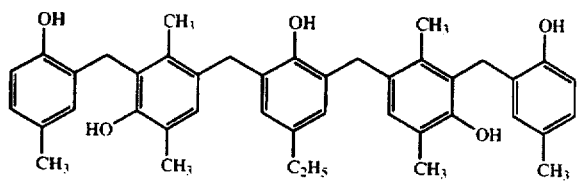

(I)

Ingredient (C): 4-(3-Hydroxyspiro[5,6,7,8,10a,8a-hexahydroxanthene-9,1'-cyclohexan]-10a-yl)benzene-1,3-diol of the following formula:

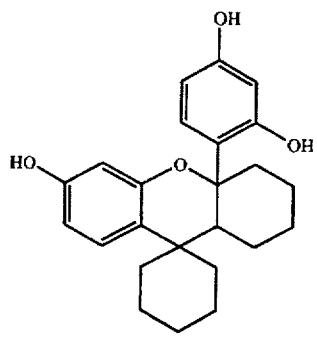

In 500 parts by weight of 2-heptanone, 100 parts by weight of Ingredient (A), 45 parts by weight of Ingredient (B) and 27 parts by weight of Ingredient (C) were dissolved, and the resulting solution was filtrated through a 0.2-μm membrane filter to thereby yield a positive photoresist composition.

Examples 2 to 5 and Comparative Examples 1 to 5

A series of positive photoresist compositions was prepared in the same manner as in Example 1, except that Ingredient (B) used in Example 1 was changed to those indicated in Table 1.

The properties of these positive photoresist compositions were evaluated and are shown in Table 2.

TABLE 1

|  | Ingredient (B) (% by weight) |
|---|---|
| Example 1 | B1 (100) |
| Example 2 | B1/B2 =(20/80) |
| Example 3 | B1/B2 =(40/60) |
| Example 4 | B1/B2/B3 =(20/40/40) |
| Example 5 | B1/B2/B3 =(40/40/20) |
| Comp. Ex. 1 | B4 (100) |
| Comp. Ex. 2 | B5 (100) |
| Comp. Ex. 3 | B6 (100) |
| Comp. Ex. 4 | B2 (100) |
| Comp. Ex. 5 | B3 (100) |

B1: A reaction product of 1 mole of the following phenolic compound with 2 moles of 1,2-naphthoquinonediazide-5-sulfonyl chloride:

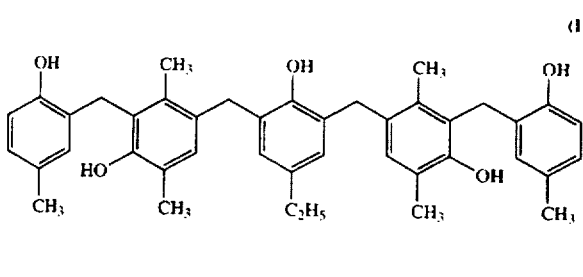

(I)

B2: A reaction product of 1 mole of the following phenolic compound with 2 moles of 1,2-naphthoquinonediazide-5-sulfonyl chloride:

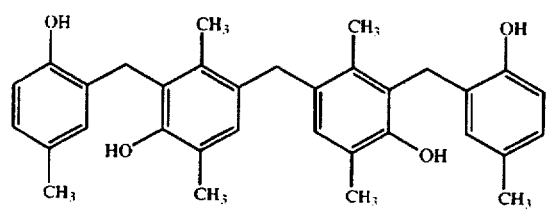

B3: A reaction product of 1 mole of the following phenolic compound with 2 moles of 1,2-naphthoquinonediazide-5-sulfonyl chloride:

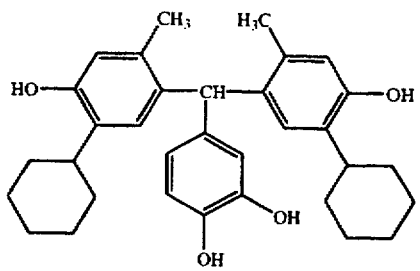

B4: A reaction product of 1 mole of the following phenolic compound with 2 moles of 1,2-naphthoquinonediazide-5-sulfonyl chloride:

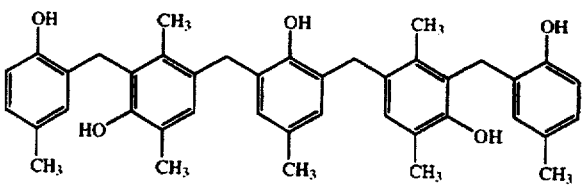

B5: A reaction product of 1 mole of the following phenolic compound with 2 moles of 1,2-naphthoquinonediazide-5-sulfonyl chloride:

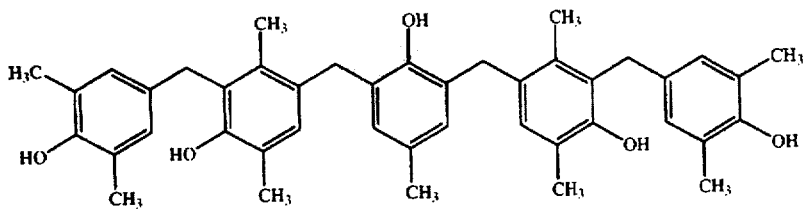

B6: A reaction product of 1 mole of the following phenolic compound with 2 moles of 1,2-naphthoquinonediazide-5-sulfonyl chloride:

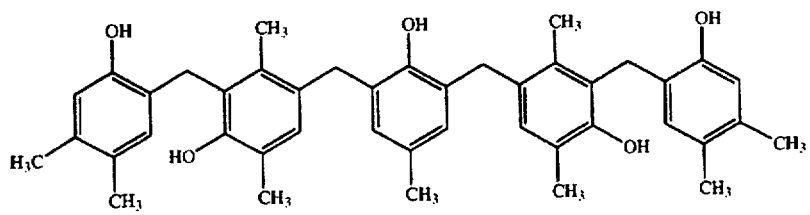

TABLE 2

| | Sensi- tivity (ms) | Depth of focus properties (μm) | | Total process margin (μm) | Isolation pattern shape on minus sift of focus | Defini- tion (μm) |
|---|---|---|---|---|---|---|
| | | Isolation pattern | Dense pattern | | | |
| Ex. 1 | 280 | 1.2 | 1.2 | 1.2 | *1 | 0.30 |
| Ex. 2 | 312 | 1.0 | 1.0 | 1.0 | *1 | 0.30 |
| Ex. 3 | 305 | 1.1 | 1.1 | 1.1 | *1 | 0.30 |
| Ex. 4 | 265 | 0.9 | 1.0 | 0.9 | *1 | 0.32 |
| Ex. 5 | 280 | 0.9 | 1.0 | 0.9 | *1 | 0.32 |
| Com.Ex.1 | 300 | 0.8 | 1.0 | 0.8 | *2 | 0.32 |
| Com.Ex.2 | 320 | 0.8 | 1.0 | 0.8 | *2 | 0.32 |
| Com.Ex.3 | 300 | 0.8 | 1.0 | 0.8 | *2 | 0.32 |
| Com.Ex.4 | 320 | 0.7 | 1.2 | 0.7 | *2 | 0.30 |
| Com.Ex.5 | 200 | 0.5 | 1.0 | 0.5 | *2 | 0.35 |

*1: The following shape:

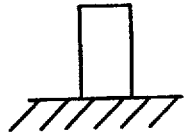

*2: The following shape:

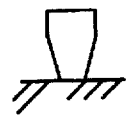

The present invention can provide a positive photoresist composition for use in the formation of an ultrafine resist pattern of not more than half a micrometer, particularly of not more than 0.35 μm. This positive photoresist composition has satisfactory sensitivity, definition and DOF properties and can concurrently form dense patterns and isolation patters both with good shapes in the formation of mixtures of these patterns. Specifically, this positive photoresist composition can minimize the formation of a back taper shape of an isolation resist pattern induced by sift of the focus to the minus side.

Other embodiments and variations will be obvious to those skilled in the art, and this invention is not to be limited to the specific matters stated above.

What is claimed is:

1. A positive photoresist composition comprising:

(A) an alkali-soluble resin; and
   (B) a photosensitive ingredient, said photosensitive ingredient (B) comprising an ester of a compound represented by following Formula (I) with a 1,2-naphthoquinonediazidosulfonyl compound:

(I)

2. A positive photoresist composition according to claim 1, further comprising (C) a sensitizer (intensifier).

3. A positive photoresist composition according to claim 1, wherein said ester of the compound represented by Formula (I) with the 1,2-naphthoquinonediazidosulfonyl compound occupies equal to or more than 20% by weight of said Ingredient (B).

4. A positive photoresist composition according to claim 1, wherein said ester contained in said Ingredient (B) is obtained by allowing 2 to 3 moles of the 1,2-naphthoquinonediazidosulfonyl compound to react with 1 mole of the compound represented by Formula (I).

5. A positive photoresist composition according to claim 1, wherein the amount of said Ingredient (B) is from 10% to 60% by weight relative to the total amount of said Ingredient (A) and Ingredient (C) a sensitizer, said Ingredient (C) being added according to necessity.

* * * * *